United States Patent [19]

Endo

[11] Patent Number: 4,961,196
[45] Date of Patent: Oct. 2, 1990

[54] SEMICONDUCTOR LASER

[75] Inventor: Kenji Endo, Tokyo, Japan

[73] Assignee: NEC Corporation, Tokyo, Japan

[21] Appl. No.: 382,878

[22] Filed: Jul. 21, 1989

[30] Foreign Application Priority Data

Jul. 22, 1988 [JP] Japan .................................. 63-184163

[51] Int. Cl.⁵ .............................................. H01S 3/19
[52] U.S. Cl. .......................................... 372/45; 372/46
[58] Field of Search ........................ 372/46, 45, 44, 43;
357/17, 16

[56] References Cited

U.S. PATENT DOCUMENTS 4,635,268 1/1987 Motegi et al. ........................... 372/45
4,757,510 7/1988 Kanene et al. .......................... 372/45

Primary Examiner—William L. Sikes
Assistant Examiner—Georgia Y. Epps
Attorney, Agent, or Firm—Sughrue, Mion, Zinn, Macpeak & Seas

[57] ABSTRACT

A semiconductor laser comprises an active layer of a quantum well structure, and a current confinement structure for avoiding the injection of carriers into regions of the active layer in the vicinities of resonator facets. The current confinement structure is different in conduction type from that of one of cladding layer, and is formed by a semiconductor layer which is transparent for a laser light. The semiconductor laser further comprises an optical waveguide structure provided between the resonator facets. In this semiconductor laser, the catastrophic damage is avoided, and the high output power is obtained.

3 Claims, 4 Drawing Sheets

SEMICONDUCTOR LASER

FIELD OF THE INVENTION

The invention relates to a semiconductor laser, and more particularly to a semiconductor laser including an active layer of a quantum well structure.

BACKGROUND OF THE INVENTION

A semiconductor laser includes a multi-layer structure having an active layer sandwiched by cladding layers having a bandgap energy wider than that of the active layer, and a pair of laser resonator facets facing each other and being perpendicular to the multi-layer structure. Recently, demands for semiconductor lasers providing higher light output power is increasing in order to improve the performance of optical information processing systems and optical communication systems. The maximum light output power is limited to some extent due to the occurrence of catastrophic optical damage, which will be described later, for semiconductor lasers with lasing wavelength less than 900 nm, such as short wavelength lasers and visible lasers. The catastrophic optical damage occurs at the active layer in the vicinities of the resonator facets in which the temperature increases locally by absorption of a part of light output power.

Two methods to avoid the occurrence of the catastrophic optical damage were reported previously. The first method is decreasing a laser light density at the active layer by expanding the distribution of the laser light to the outside of the active layer. The second method is decreasing the light absorption coefficient of the active layer in the vicinities of the resonator facets.

For instance, a large optical cavity structure, which have (an) optical waveguide layer(s) between an active layer and cladding layers, expands the laser light distribution in a direction perpendicular to the active layer, and effectively decreases the laser light density at the active layer. Further, it has been reported that a non-absorption mirror structure, which includes a semiconductor layer having a bandgap energy wider than that of an active layer in regions of resonator facets and the vicinities thereof, and a window structure, in which an active layer is p-type in an active region, and n-type of a high carrier concentration in the vicinities of resonators facets, are effective to decrease the absorption coefficient of the active layer in the vicinities of the resonator's facets, and increase a light output power limit. Still further, a high output semiconductor laser including an active layer of a quantum well structure has been described in "The light amount IC study meeting paper OQE85-79, The institute of Electronics Information and Communication Engineers". The quantum well semiconductor laser comprises a first cladding layer, a multi-quantum well active layer, a second cladding layer, a $SiO_2$ film and a cap layer successively provided on a substrate. The quantum well semiconductor laser further comprises an n-electrode provided on the $SiO_2$ film to contact with the cap layer, and a p-electrode provided on the back surface of the substrate. In this quantum well semiconductor laser, Zn preferential diffusion regions are provided on both sides of a stripe excitation region to disorder the multi-quantum well active layer, so that the structure converted to a uniform composition in which a refractive index and a bandgap energy of the multi-quantum well active layer are low and wide, respectively, is obtained. As a result, a high light output power is obtained in the quantum well semiconductor laser, because the absorption coefficient for a laser light in regions of the active layer in the vicinities of resonator facets is decreased due to the disorder.

However, the large optical cavity structure has a disadvantage of increase in threshold current and operation current. This results in the occurrence of the saturation of a light output power due to Joule heating, at lower output power than that limited by the catastrophic optical damage.

Further, the non-absorbing mirror laser and the window structure laser, in which the absorption coefficient in the active layer is decreased in the vicinities of the resonator facets, have a disadvantage of large variety in laser performance, because it is difficult to control the quality of the interface between the active layer and the buried layer and an impurity concentration of the excitation region and the regions in the vicinities of the resonator facets.

Still further, the laser device including the multi-quantum well active layer which is disordered in the regions of the resonator facets has a disadvantage of limited effect of light output power improvement, because of relatively light absorption coefficient ranging from 225 to 450 $cm^{-1}$ in the vicinities of the resonator facets due to high carrier concentration of over $10^{19}$ $cm^{-3}$ in the disordered region.

SUMMARY OF THE INVENTION

Accordingly, it is a first object of the invention to provide a semiconductor laser in which the maximum light output power is not limited by the catastrophic optical damage and becomes higher.

It is a second object of the invention to provide a semiconductor laser in which a uniform characteristic is obtained.

According to the invention, a semiconductor laser comprises an active layer of a quantum well structure and a current confinement structure for avoiding the injection of carriers into regions of the active layer in the vicinities of the resonator facets. The current confinement structure is different in conduction type from that of one of the cladding layers, and is formed by a semiconductor layer which is transparent for a laser light. The semiconductor laser further comprises an optical waveguide structure provided between the resonator facets.

BRIEF DESCRIPTION OF DRAWINGS

The invention will be explained in more detail in conjunction with appended drawings, wherein.

DESCRIPTION OF PREFERRED EMBODIMENTS

Figure 1:
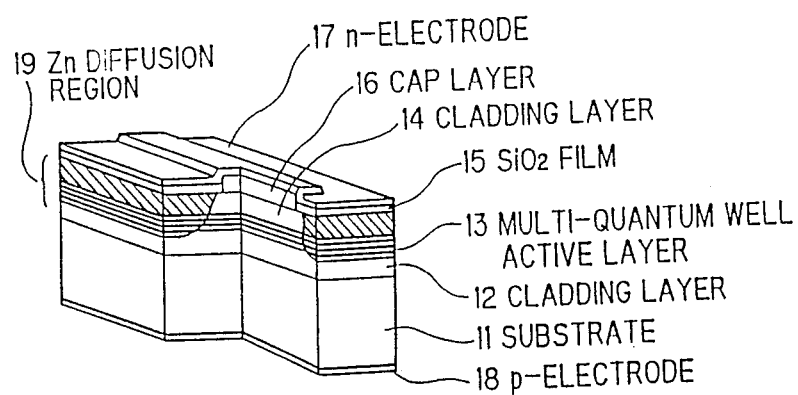
FIG. 1 is a cross sectional perspective view showing a conventional semiconductor laser.

Before explaining an embodiment according to the invention, the aforementioned quantum well semiconductor laser will be explained in FIG. 1. The quantum well semiconductor laser comprises a semiconductor substrate 11, and a first cladding layer 12, a multi-quantum well active layer 13, a second cladding layer 14, and a $SiO_2$ film 15 successively provided on the substrate 11. In an aperture of the $SiO_2$ film, a cap layer 16 which is in contact with an n-electrode 17 is provided, and a p-electrode 18 is provided on the back surface of the substrate 11. In this semiconductor laser, Zn preferential diffusion layers 19 are provided to disorder the multi-quantum well active layer 13 on both sides of a stripe active region. The advantage and disadvantage of this quantum well semiconductor laser are not explained here, because these were explained before.

Figure 2A:
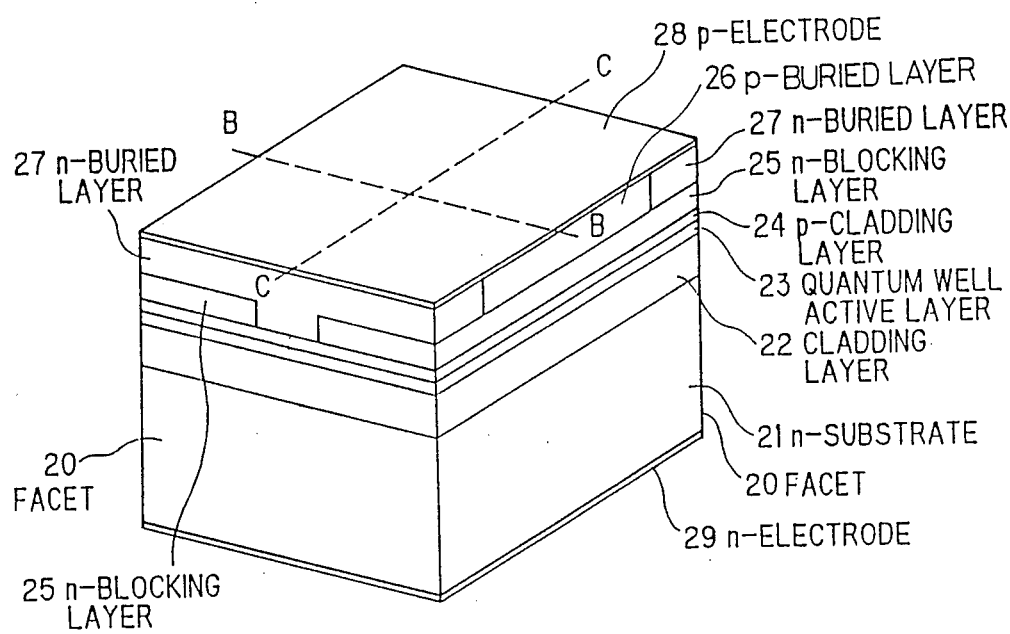
FIGS. 2A to 2C are a perspective view, a cross sectional view cut along a line B—B in FIG. 2A, and a cross sectional view cut along a line C—C in FIG. 2A, respectively, showing a semiconductor laser in a first embodiment according to the invention.
Figure 2B:
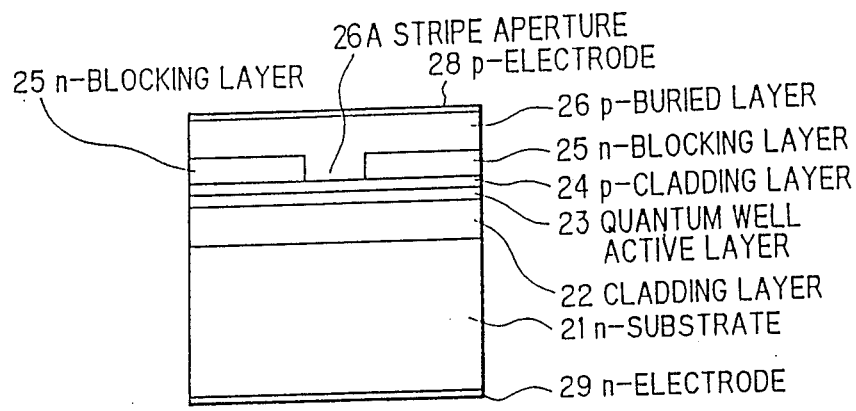
Figure 2C:
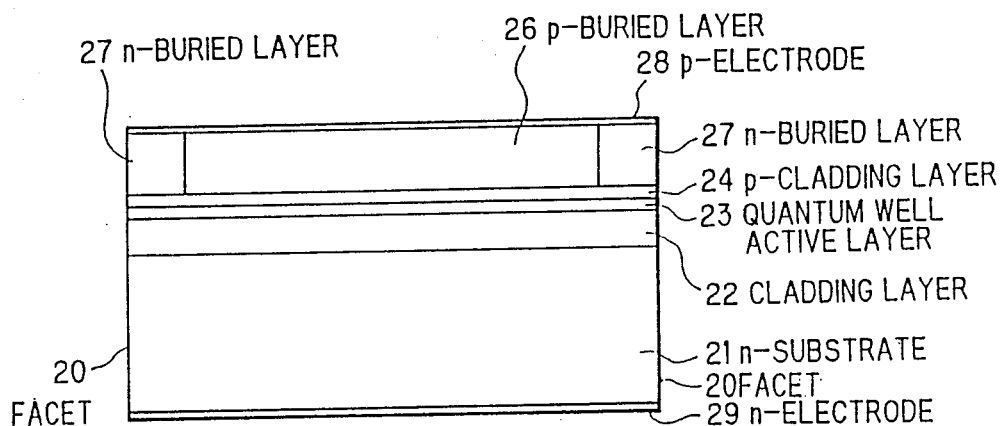

Next, a semiconductor laser in a first embodiment according to the invention will be explained. FIGS. 2A to 2C show the semiconductor laser which comprises an n-GaAs substrate 21, and an n-$AL_{0.45}Ga_{0.55}As$ cladding layer 22, an ALGaAs quantum well active layer 23, a p-$AL_{0.45}Ga_{0.55}As$ cladding layer 24, an n-GaAs blocking layer 25, a p-$AL_{0.45}Ga_{0.55}As$ buried layer 26, and an n-$AL_{0.45}Ga_{0.55}As$ buried layers 27 successively provided on the substrate 21. The semiconductor laser further comprises a p-electrode 28 provided on the buried layers 26 and 28, and an n-electrode 29 provided on the back surface of the substrate 21, and provides resonator facets 20 on both front and rear planes of the resonator. FIG. 2B shows a cross section of the resonator at the transverse center thereof, and FIG. 2C shows a cross section of the resonator at the longitudinal center thereof. As shown therein, the n-GaAs blocking layer 25 is preferentially removed to provide a stripe aperture in the longitudinal direction of the resonator, and is buried with the n-$AL_{0.45}Ga_{0.55}As$ buried layers 27 in the regions in the vicinities of the resonator facets 20, and with the p-$AL_{0.45}Ga_{0.55}As$ buried layer 26 in the central portion of the resonator.

In operation, a region of the active layer 23 which is just below the aforementioned stripe aperture functions as an oscillation region. The injected carrier density in the active layer 23 in the vicinities of the resonator facets 20 is remarkably low as compared to that in the active region, because the injected carriers are restricted longitudinally due to the presence of the n-buried layers 27. The regions in the vicinities of the resonator facets 20 of the active layer 23 become nearly transparent for a laser light due to low injected carrier density. Therefore, the catastrophic damage is hard to occur, and a high light output power is obtained. The n-blocking layers 25 functions not only as the current confinement layers, but also as light absorption layers. The effective refractive indices of the multi-layer structure are high just below the stripe aperture, and low outside that region, so that an optical waveguide structure is realized in the direction parallel to the active layer to provide stable transverse oscillation. This optical waveguide structure is formed even in the non-carrier injected regions in the vicinities of the resonator facets 20, so that the transverse mode control is carried out therein. This avoids increase in a threshold current for the semiconductor laser.

Figure 3A:
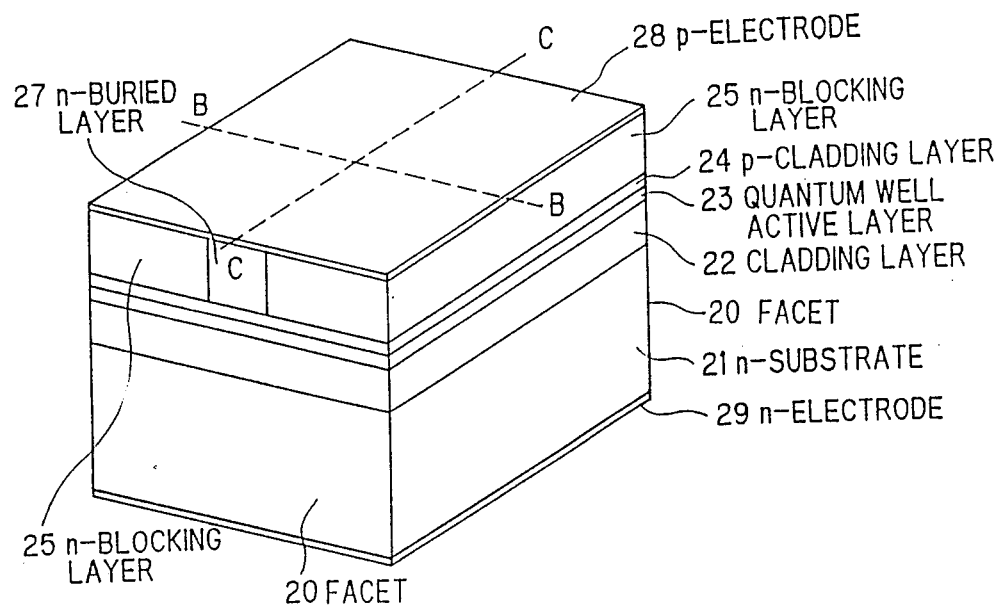
FIGS. 3A to 3C are a perspective view, a cross sectional view cut along a line B—B in FIG. 3A, and a cross sectional view cut along a line C—C in FIG. 3A, respectively, showing a semiconductor laser in a second embodiment according to the invention.
Figure 3B:
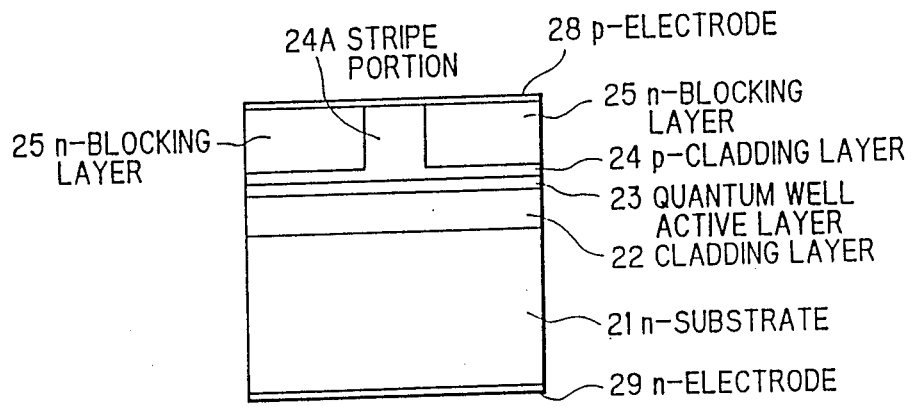
Figure 3C:
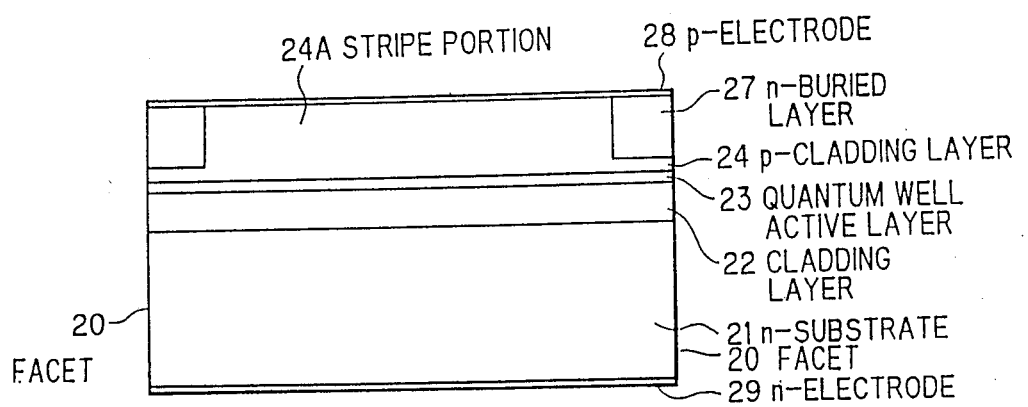

FIGS. 3A to 3C show a semiconductor laser in a second embodiment according to the invention, wherein like parts are indicated by like reference numerals as used in FIGS. 2A to 2C. An n-$AL_{0.45}Ga_{0.55}As$ cladding layer 22, a $AL_{0.45}Ga_{0.55}As$ quantum well active layer 23, and a p-$AL_{0.45}Ga_{0.55}As$ cladding layer 24 are successively grown on an n-GaAs substrate 21 by epitaxial growth. The p-cladding layer 24 is preferentially removed to provide a stripe portion 24A which is buried with n-GaAs blocking layers 25 on its both sides, and with n-$AL_{0.45}Ga_{0.55}As$ buried layers 27 on its front and rear sides. A p-electrode 28 is provided on the stripe portion 24A of the p-cladding layer 24, and the n-blocking layers 25 and 27, and an n-electrode 29 is provided on the back surface of the substrate 21.

In this semiconductor laser of the second embodiment, the current confinement structure and the optical waveguide structure are obtained as explained in the first embodiment. As a result, the advantages of a low threshold current and improvement in light output power limit are realized.

As understood from the first and second embodiments, non-carrier injection regions are provided in the quantum well active layer 23 in the vicinities of resonator facets 20, so that the absorption coefficient for a laser light is decreased and the maximum to light output power limited by the catastrophic optical damage at this active layer is increased.

An absorption coefficient of a quantum well is sharply increased at a specific wavelength in accordance with the quantum effect of a state density. In this point, it is reported that an energy width of a transition region is as narrow as 20 to 30 meV. A lasing wavelength of a semiconductor laser including an active layer of a quantum well structure is longer than a wavelength which is expected based on an absorption spectrum due to the bandgap energy shrinkage effect at high density carrier injection in the same manner as in an ordinary double heterostructure semiconductor laser. An ordinary injection carrier density is approximately as high as $2 \times 10^{18}$ cm$^{-3}$ at threshold current, wherein the energy shift of a lasing wavelength is approximately 40 to 50 meV. Therefore, the absorption coefficient becomes as low as less than 100 cm$^{-1}$ for a laser light in the noncarrier injection regions. In the invention, a semiconductor laser is provided with the non-carrier injection regions in the vicinities of resonator facets, so that the catastrophic optical damage is hard to occur, and the high output power is obtained.

The effect of absorption coefficient reduction in the non-carrier injection regions is remarkable for a semiconductor laser including an active layer of a quantum well structure. In an ordinary double heterostructure semiconductor laser, the absorption coefficient of an active layer increases moderately at lasing wavelength, and a transition region is approximately as wide as 100 meV. For this reason, the absorption coefficient is as high as several hundreds cm$^{-1}$ for a laser light in non-carrier injection regions provided in the vicinities of resonator facets, even if the bandgap energy shrinkage effect occurs due to the high density carrier injection.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. In a semiconductor laser, the improvement, comprising:
    a multi-layer structure including an active layer, a first and second cladding layers, said active layer including quantum well structure sandwiched by said first and second cladding layers, the bandgap energy of said cladding layers being wider than that of said active layer;
    resonator facets perpendicular said multi-layers; and
    layers different in conductivity type from said first cladding layer provided over said first cladding layer and extending inwardly from said resonator facets to reduce injected carrier density in said active layer at said resonator facets to thereby make said active layer transparent to laser light at said resonator facets.

2. A semiconductor laser, according to claim 1, wherein:
    said current confinement structure includes a blocking layer having a stripe aperture, said semiconductor layers being provided on said blocking layer and buried into said stripe aperture at and extending inwardly a selected distance from said resonator facets.

3. A semiconductor laser, according to claim 1, wherein:
    a semiconductor layer provided between said semiconductor layers of said current confinement structure is a stripe portion of said first cladding layer.

* * * * *